(12) United States Patent
Kim et al.

(10) Patent No.: US 9,203,024 B2
(45) Date of Patent: Dec. 1, 2015

(54) COPPER COMPATIBLE CHALCOGENIDE PHASE CHANGE MEMORY WITH ADJUSTABLE THRESHOLD VOLTAGE

(75) Inventors: Yudong Kim, Cupertino, CA (US); Charles C. Kuo, Union City, CA (US); Gianpaolo Spadini, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 2066 days.

(21) Appl. No.: 11/881,080

(22) Filed: Jul. 25, 2007

(65) Prior Publication Data

US 2009/0026437 A1  Jan. 29, 2009

(51) Int. Cl.
 H01L 21/00 (2006.01)
 H01L 21/06 (2006.01)
 H01L 45/00 (2006.01)
 H01L 27/24 (2006.01)

(52) U.S. Cl.
 CPC .......... H01L 45/144 (2013.01); H01L 27/24 (2013.01); H01L 45/06 (2013.01); H01L 45/126 (2013.01); H01L 45/1233 (2013.01); H01L 45/1683 (2013.01)

(58) Field of Classification Search
 USPC .......... 365/148, 163, 158, 173, 189.09, 51; 257/E45.002, E27.07, E45.003; 438/95
 See application file for complete search history.

(56) References Cited

U.S. PATENT DOCUMENTS

| | | | | |
|---|---|---|---|---|
| 5,536,947 A * | 7/1996 | Klersy et al. | | 257/3 |
| 5,687,112 A * | 11/1997 | Ovshinsky | | 365/163 |
| 5,714,768 A * | 2/1998 | Ovshinsky et al. | | 257/40 |
| 5,825,046 A * | 10/1998 | Czubatyj et al. | | 257/2 |
| RE37,259 E * | 7/2001 | Ovshinsky | | 365/163 |
| 6,969,866 B1 * | 11/2005 | Lowrey et al. | | 257/3 |
| 6,985,389 B2 * | 1/2006 | Ma | | 365/189.07 |
| 6,998,289 B2 * | 2/2006 | Hudgens et al. | | 438/95 |
| 7,023,009 B2 * | 4/2006 | Kostylev et al. | | 257/4 |
| 7,382,647 B1 * | 6/2008 | Gopalakrishnan | | 365/163 |
| 2004/0067634 A1 * | 4/2004 | Kim et al. | | 438/622 |
| 2004/0256694 A1 * | 12/2004 | Kostylev et al. | | 257/536 |
| 2005/0026445 A1 * | 2/2005 | Han | | 438/701 |
| 2005/0051512 A1 * | 3/2005 | Lin | | 216/13 |
| 2005/0122771 A1 * | 6/2005 | Chen | | 365/163 |
| 2006/0054991 A1 * | 3/2006 | Kuo et al. | | 257/528 |
| 2006/0073631 A1 * | 4/2006 | Karpov et al. | | 438/102 |
| 2006/0110846 A1 * | 5/2006 | Lowrey et al. | | 438/95 |
| 2006/0246712 A1 * | 11/2006 | Kim et al. | | 438/622 |
| 2006/0257787 A1 * | 11/2006 | Kuo et al. | | 430/270.13 |
| 2007/0018148 A1 * | 1/2007 | Kuo et al. | | 257/2 |
| 2007/0026566 A1 * | 2/2007 | Karpov et al. | | 438/102 |
| 2007/0105267 A1 * | 5/2007 | Karpov et al. | | 438/95 |
| 2007/0247899 A1 * | 10/2007 | Gordon et al. | | 365/163 |
| 2007/0249090 A1 * | 10/2007 | Philipp et al. | | 438/102 |
| 2007/0259479 A1 * | 11/2007 | Kuo et al. | | 438/102 |
| 2008/0029752 A1 * | 2/2008 | Karpov et al. | | 257/2 |
| 2008/0067486 A1 * | 3/2008 | Karpov et al. | | 257/3 |
| 2008/0304307 A1 * | 12/2008 | Gopalakrishnan | | 365/51 |
| 2009/0050872 A1 * | 2/2009 | Kuo et al. | | 257/3 |

\* cited by examiner

*Primary Examiner* — Julio J Maldonado
*Assistant Examiner* — Cory Eskridge
(74) *Attorney, Agent, or Firm* — Trop, Pruner & Hu, P.C.

(57) ABSTRACT

A phase change memory cell may include two or more stacked or unstacked series connected memory elements. The cell has a higher, adjustable threshold voltage. A copper diffusion plug may be provided within a pore over a copper line. By positioning the plug below the subsequent chalcogenide layer, the plug may be effective to block copper diffusion upwardly into the pore and into the chalcogenide material. Such diffusion may adversely affect the electrical characteristics of the chalcogenide layer.

25 Claims, 4 Drawing Sheets

COPPER COMPATIBLE CHALCOGENIDE PHASE CHANGE MEMORY WITH ADJUSTABLE THRESHOLD VOLTAGE

BACKGROUND

This relates generally to phase change memories that use chalcogenide materials.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Figure 1:
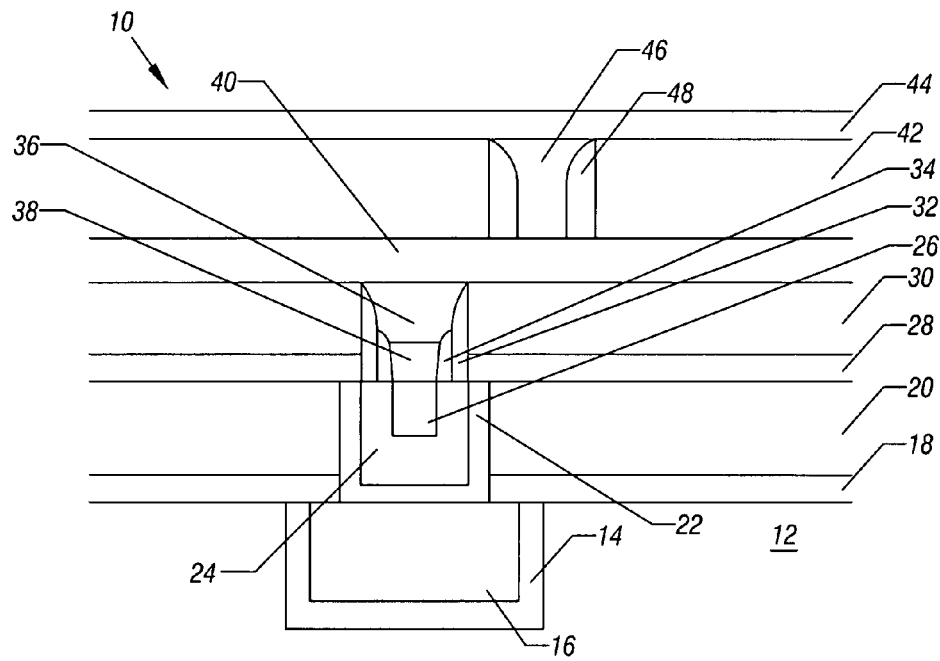
FIG. 1 is an enlarged, cross-sectional view of one embodiment of the present invention.

Referring to FIG. 1, a phase change memory cell may have the chalcogenide memory element. While a select device is not depicted, in other embodiments, a select device such as an ovonic threshold switch may be used, together with the memory element.

In accordance with some embodiments of the present invention, the chalcogenide that forms the memory element may be isolated from the copper used for interconnects. Namely, copper may be utilized for the metal connections such as the row and column lines in some embodiments.

Referring to FIG. 1, a dielectric layer 12, such as oxide, may have a copper line 16 formed therein in a damascene process. The copper line 16 may be separated from the substrate 12 by a seed layer 14. Over the substrate 12 and aligned with the line 16 may be a pore in which are formed a plug made up of multiple layers of metal.

For example, in one embodiment, the first layer 22 of metal may be U-shaped and may be formed of tantalum. The second layer 24 of metal, on top of the first layer 22, may be U-shaped as well and may be formed of tantalum nitride. The center 26 of the plug may be formed of titanium silicon nitride in one embodiment. The effect of the plug and its multiple layers is to block copper migration from the copper line 16 into the overlying chalcogenide.

The pore may be formed within a layer of dielectric which may be formed of one or more materials. For example, in one embodiment, the dielectric may include a nitride layer 18 covered by an oxide layer 20. However, other dielectric materials may be utilized.

At the next level, the memory element may be formed using a heater 38. In one embodiment, the heater 38 may be formed of titanium silicon nitride. The heater 38 may be formed in a pore having a pair of spacers 32 and 34. However, in some embodiments, a single spacer may be utilized and, in other embodiments, more or less spacers may be used.

The pore may be defined by dielectric materials which may include one or more layers. For example, a nitride layer 28 may be covered by an oxide layer 30 in one embodiment. Over the heater 38 and within the pore defined by the spacers 32 and 34 may be the chalcogenide material 36. In one embodiment, the chalcogenide material may be GeSbTe (GST).

The next level may include the first upper electrode 40 which may be aligned with the chalcogenide material 36.

Next, one or more additional memory elements may be built on top of the memory element already defined. Specifically, a second memory element, in series with the first memory element, may include a dielectric layer 42, a sidewall spacer 48, and a chalcogenide material 46 covered by a second upper electrode 44.

A pore may be formed in the dielectric layer 42, the pore may be filled with a sidewall spacer material which is then anisotropically etched to form the sidewall spacers 48. Thereafter, the chalcogenide material 46 may be deposited and planarized. Finally, the second upper electrode 44 may be formed by deposition. Of course, other fabrication techniques may also be utilized.

In some embodiments, the formation of two or more memory elements in series configuration enable the threshold voltage of the overall cell to be adjusted. While an embodiment is illustrated in which stacked memory elements are utilized, memory elements may also be formed in the same plane and then coupled by electrical routing.

Depending on the number of memory elements in series, different combined threshold levels may be demonstrated, allowing adjustment of the threshold voltage of the cell. In some embodiments, phase change memories may have threshold voltages which are too low for some applications. By combining memory elements in series, the threshold voltages may be raised. For example, a stack of two memory elements may have a threshold voltage which is roughly equal to twice the threshold voltage of one of said memory elements.

The second upper electrode 44 may be patterned with a lithographic etch step and covered with a nitride encapsulation layer. Subsequently, oxide may be deposited and polished. Then trenches are patterned into which a seed layer and copper is subsequently deposited.

In some embodiments, a threshold device may be formed on top of the memory elements just described. The threshold device, in one embodiment, may be an ovonic threshold switch.

Figure 2:
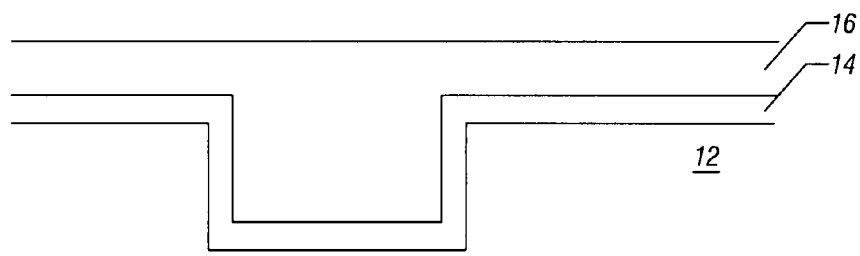
FIG. 2 is an enlarged, cross-sectional view at an early stage in accordance with one embodiment.

In accordance with one embodiment, a fabrication sequence may begin, as shown in FIG. 2, by forming a damascene structure in the dielectric layer 12. The damascene structure may include a seed layer 14 which may be any conventional copper seed layer made up of one or more elements. Over the seed layer may be blanket deposited a copper line 16 which may be called a row line. Any conventional technique for the deposition or formation of a copper layer may be utilized, including electroplating, electroless plating, or sputtering. Thereafter, the copper layer 16 may be planarized and the next level fabrication can begin.

Figure 3:
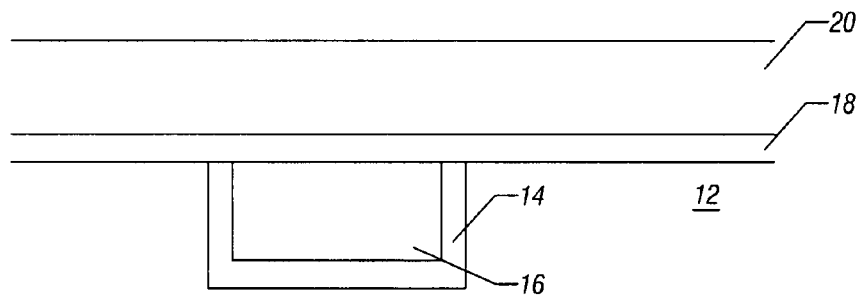
FIG. 3 is an enlarged, cross-sectional view at a subsequent stage in accordance with one embodiment.

The next level may include a dielectric material which is formed over the layer 12. In one embodiment, it may include a nitride layer 18, covered by an oxide layer 20 of greater thickness as shown in FIG. 3.

Figure 4:
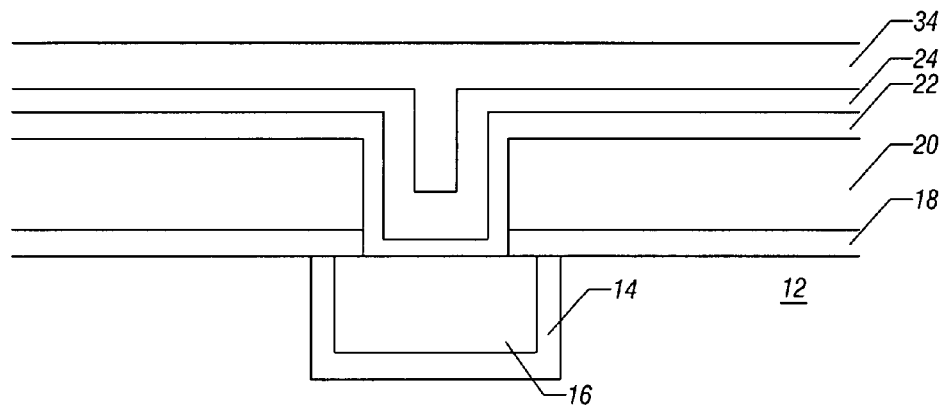
FIG. 4 is an enlarged, cross-sectional view at a subsequent stage in accordance with one embodiment.

Referring to FIG. 4, a pore may be formed through the dielectric made up of layers 18 and 20 and the pore may be filled with a plug. The plug may be effective to block migration of copper from the line 16 upwardly to the overlying chalcogenide material not yet deposited.

In one embodiment, the plug may be made up of three different materials, including a first layer 22 of tantalum, a second layer 24 of tantalum nitride, and a third layer 26 of titanium silicon nitride. The tantalum nitride and tantalum is preferably not included within the upper portion that contacts the subsequently deposited chalcogenide.

Figure 5:
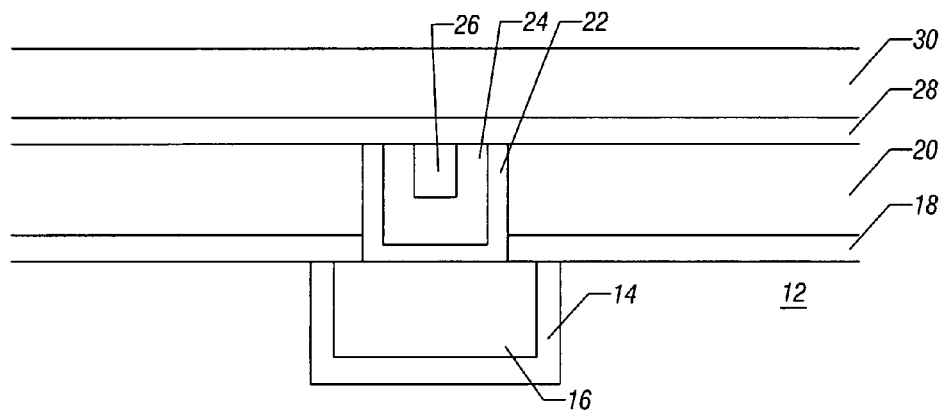
FIG. 5 is an enlarged, cross-sectional view at a subsequent stage in accordance with one embodiment.

Following the formation of the plug, as shown in FIG. 4, the structure may be planarized to achieve the planar structure shown in FIG. 5. Extensive oxide over polish may be used to reduce underlying copper row topology. This may be done to avoid dished areas which can trap chalcogenide material in the subsequent chalcogenide chemical mechanical planarization step.

After the plug polish, nitride 28 and oxide 30 layers may be deposited and patterned.

Figure 6:
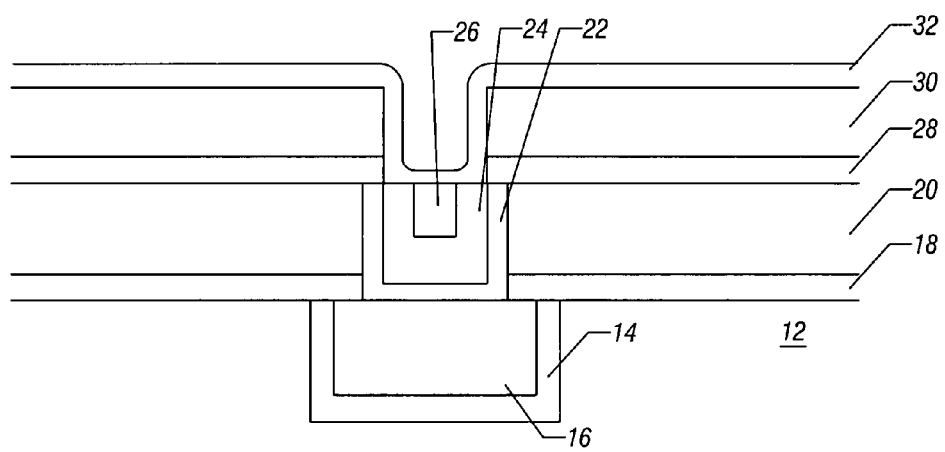
FIG. 6 is an enlarged, cross-sectional view at a subsequent stage in accordance with one embodiment.
Figure 7:
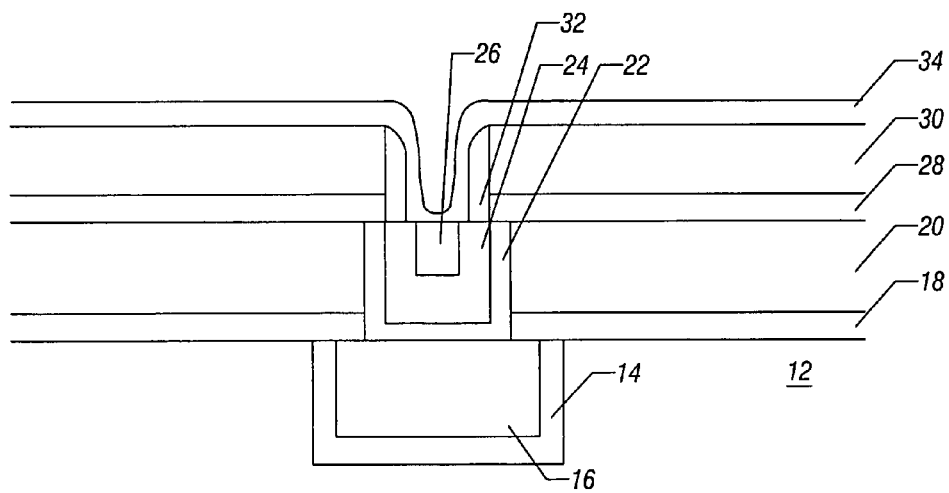
FIG. 7 is an enlarged, cross-sectional view at a subsequent stage in accordance with one embodiment.

Then, referring to FIG. 6, a pore may be formed through the layers 28 and 30 and the pore may be filled with a first spacer layer 32. The use of a dual spacer layer may reduce the pore diameter and minimize the heater seam in some embodiments. The first spacer layer may be anisotropically etched to form the spacer 32 shown in FIG. 7. This may be followed by the deposition of the second spacer layer 34 which, likewise, may be anisotropically etched to form the dual spacers as shown in FIG. 8.

Figure 8:
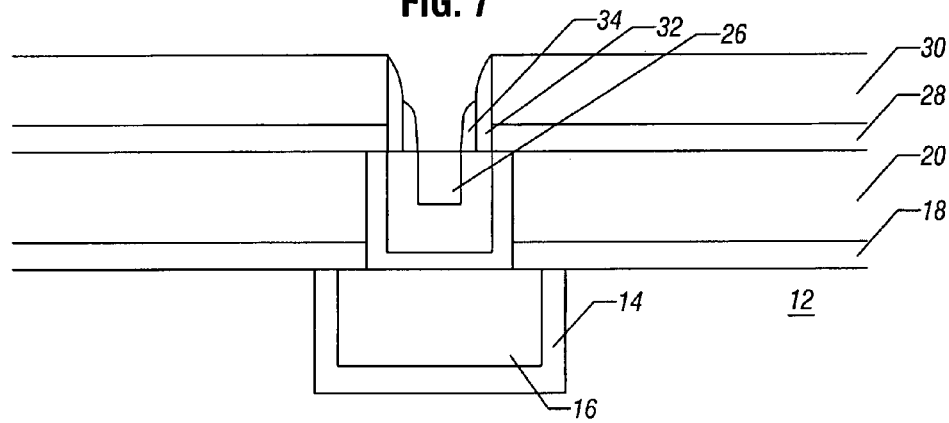
FIG. 8 is an enlarged, cross-sectional view at a subsequent stage in accordance with one embodiment.
Figure 9:
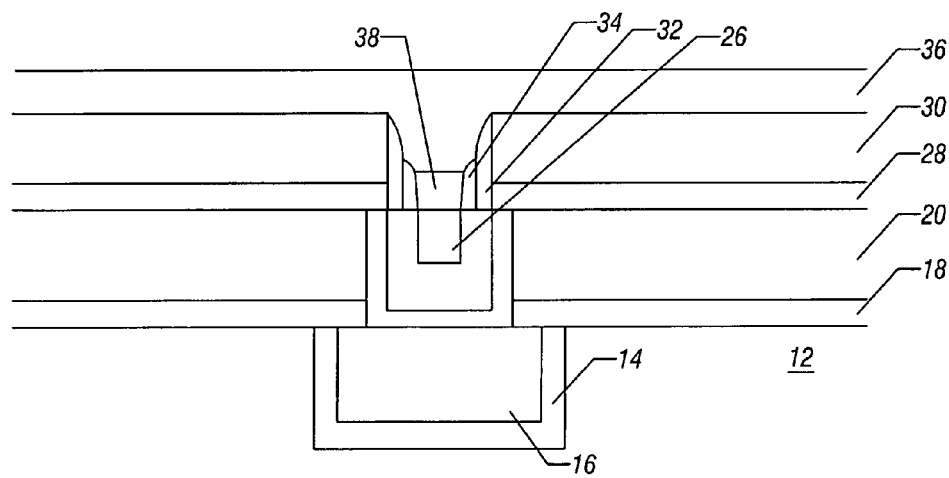
FIG. 9 is an enlarged, cross-sectional view at a subsequent stage in accordance with one embodiment.

Into the resulting pore may be deposited a heater 38, as shown in FIG. 8. In one embodiment, the heater may be formed of titanium silicon nitride. It is deposited into the remaining pore and then etched back to reduce its vertical height. The heater may be removed using a dip back or wet or dry etch back. This etching back of the heater 38 leaves a recess to deposit the chalcogenide material 36, as shown in FIG. 9.

Figure 10:
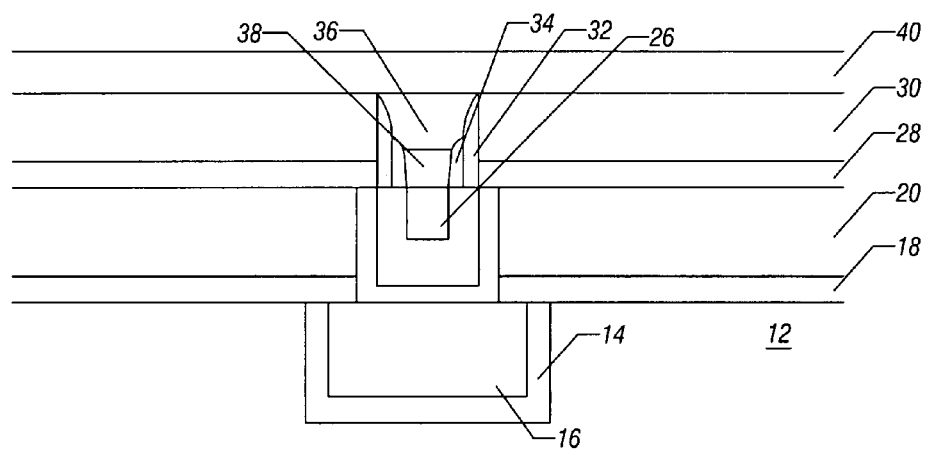
FIG. 10 is an enlarged, cross-sectional view at a subsequent stage in accordance with one embodiment.

Then the chalcogenide material 36 is polished back in a chemical mechanical planarization step. Thereafter, the first upper electrode 40 is deposited, as shown in FIG. 10. Thereafter, one or more additional memory elements may be stacked thereover to form the structure of FIG. 1. A number of variations in the process may be utilized, including removing the heater formation steps, creating a heaterless cell that can be applied.

In accordance with another embodiment of the present invention, after planarizing the layers 22, 24, and 26, those layers may be etched back partially from the pore, creating an opening at the upper end of that pore. Then, a heater and a chalcogenide material may be formed thereover, still within the same pore as the plug made up of the layers 22, 24, and 26. As a result, the pore that includes the heater and the chalcogenide memory is self-aligned to the plug. In other embodiments, the heater may be totally omitted.

Programming of the chalcogenide material 36 to alter the state or phase of the material may be accomplished by applying voltage potentials to the line 16, formed on substrate 12, and top electrode 40, thereby generating a voltage potential across the memory element. When the voltage potential is greater than the threshold voltage of memory element, then an electrical current may flow through the chalcogenide material 36 in response to the applied voltage potentials, and may result in heating of the chalcogenide material 36 by the heater 38.

This heating may alter the memory state or phase of the chalcogenide material 36. Altering the phase or state of the chalcogenide material 36 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in a crystalline or semi-crystalline state. Both "reset" and "set" states can exist without any energy (electrical, optical, mechanical) applied to bistable chalcogenide. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 11:
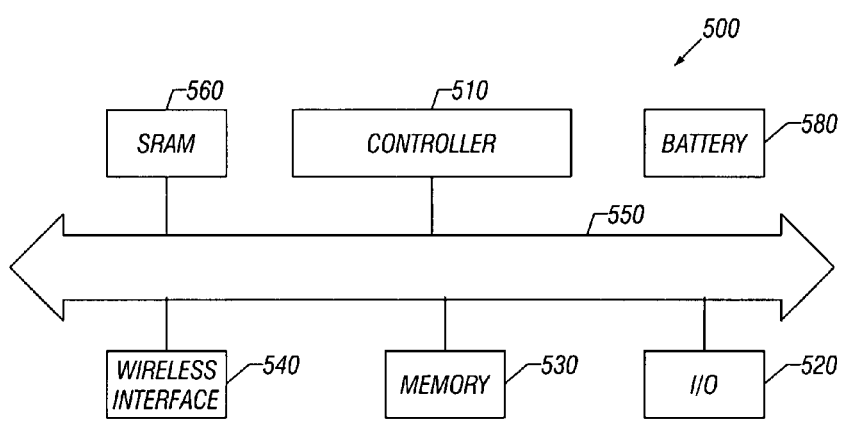
FIG. 11 is a system depiction in accordance with one embodiment of the present invention.

Turning to FIG. 11, a portion of a system 500 in accordance with an embodiment of the present invention is described. System 500 may be used in wireless or mobile devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

In accordance with some embodiments of the present invention, the process may be completely compatible with conventional copper interconnect lines, thereby allowing stackable phase change memory array layers. Also, the problems associated with dot patterning of the chalcogenide material may be reduced.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a phase change memory cell including two series connected programmable memory elements, said memory elements to store information by programming them to either of two programmable states;
   forming a pore over a copper signal line formed in a substrate;
   forming a material in the pore to block the migration of copper from the signal line upwardly into the pore;
   forming a chalcogenide in said pore over said material;
   forming said material in multiple layers; and
   forming one of said layers of tantalum and spacing said tantalum layer from said chalcogenide using another of said layers.

2. The method of claim 1 including forming two tantalum layers including one layer of tantalum nitride and another layer of tantalum, said tantalum nitride layer being formed over said tantalum layer.

3. The method of claim 1 including forming a layer over said tantalum layer, said layer over said tantalum containing layer including titanium silicon nitride.

4. The method of claim 1 including providing a layer including titanium silicon nitride between said tantalum layer and said chalcogenide.

5. The method of claim 1 including forming said material by depositing said material and then planarizing said material.

6. The method of claim 5 including depositing a dielectric over said planarized material.

7. The method of claim 6 including forming an opening in said dielectric material, said opening being part of said pore, said chalcogenide being formed in said opening.

8. The method of claim 7 including forming sidewall spacers in said opening.

9. The method of claim 8 including forming a pair of overlapping sidewall spacers in said opening.

10. The method of claim 9 including forming a heater in said opening under said chalcogenide.

11. The method of claim 1 including stacking said memory elements.

12. A memory comprising:
    a substrate; and
    a cell formed over said substrate including at least two series connected programmable phase change memory elements, said memory elements to store information by programming them to either of two programmable states; said cell further includes:
    a copper signal line;
    a copper diffusion barrier over said copper signal line, wherein said copper diffusion barrier includes tantalum;
    a chalcogenide formed over said copper diffusion barrier; and
    a layer including titanium silicon nitride between said copper diffusion barrier and said chalcogenide.

13. The memory of claim 12 wherein said copper diffusion barrier includes at least two layers.

14. The memory of claim 12 wherein said copper diffusion barrier includes at least three layers.

15. The memory of claim 12 including a layer of tantalum covered by a layer of tantalum nitride.

16. The memory of claim 12 including a pore over said copper diffusion barrier, said pore including a sidewall spacer and a chalcogenide material.

17. The memory of claim 16 wherein said pore over said copper diffusion barrier includes a pair of overlapping sidewall spacers.

18. The memory of claim 12 wherein said memory elements are stacked.

19. A method comprising:
    forming a phase change memory cell including two series connected programmable memory elements, said memory elements to store information by programming them to either of two programmable states;
    forming a pore over a copper signal line formed in a substrate;
    forming a material in the pore to block the migration of copper from the signal line upwardly into the pore;
    forming a chalcogenide in said pore over said material;
    forming said material by depositing said material and then planarizing said material; and
    depositing a dielectric over said planarized material.

20. The method of claim 19 including forming an opening in said dielectric material, said opening being part of said pore, said chalcogenide being formed in said opening.

21. The method of claim 20 including forming sidewall spacers in said opening.

22. The method of claim 21 including forming a pair of overlapping sidewall spacers in said opening.

23. The method of claim 22 including forming a heater in said opening under said chalcogenide.

24. A memory comprising:

a substrate; and a cell formed over said substrate including at least two series connected programmable phase change memory elements, said memory elements to store information by programming them to either of two programmable states; said cell further includes:

a copper signal line;

a copper diffusion barrier over said copper signal line;

a chalcogenide formed over said copper diffusion barrier; and a pore over said copper diffusion barrier, said pore including a sidewall spacer and a chalcogenide material.

25. The memory of claim 24 wherein said pore over said copper diffusion barrier includes a pair of overlapping sidewall spacers.

* * * * *